(12) United States Patent
Mahler et al.

(10) Patent No.: US 7,932,180 B2
(45) Date of Patent: Apr. 26, 2011

(54) MANUFACTURING A SEMICONDUCTOR DEVICE VIA ETCHING A SEMICONDUCTOR CHIP TO A FIRST LAYER

(75) Inventors: Joachim Mahler, Regensburg (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 162 days.

(21) Appl. No.: 12/168,567

(22) Filed: Jul. 7, 2008

(65) Prior Publication Data

US 2010/0001414 A1 Jan. 7, 2010

(51) Int. Cl.
*H01L 21/00* (2006.01)
(52) U.S. Cl. ....................................... 438/667
(58) Field of Classification Search .......... 438/106–127, 438/667
See application file for complete search history.

(56) References Cited

U.S. PATENT DOCUMENTS

| | | | |
|---|---|---|---|
| 5,858,814 A * | 1/1999 | Goossen et al. | 438/107 |
| 6,187,611 B1 | 2/2001 | Preston et al. | |
| 6,251,705 B1 * | 6/2001 | Degani et al. | 438/108 |
| 6,624,522 B2 | 9/2003 | Standing et al. | |
| 6,632,706 B1 * | 10/2003 | Leedy | 438/109 |
| 6,759,268 B2 * | 7/2004 | Akagawa | 438/106 |
| 6,911,392 B2 | 6/2005 | Bieck et al. | |
| 6,964,915 B2 | 11/2005 | Farnworth et al. | |
| 7,268,012 B2 | 9/2007 | Jiang et al. | |
| 7,300,857 B2 | 11/2007 | Akram et al. | |
| 2005/0176174 A1 * | 8/2005 | Leedy | 438/107 |
| 2008/0054479 A1 | 3/2008 | Watanabe | |

FOREIGN PATENT DOCUMENTS

| | | |
|---|---|---|
| DE | 4411409 | 10/1995 |
| EP | 1148544 | 10/2001 |

* cited by examiner

*Primary Examiner* — Richard A. Booth
(74) *Attorney, Agent, or Firm* — Dicke, Billig & Czaja, P.L.L.C.

(57) ABSTRACT

A method of manufacturing a semiconductor device. The method includes providing a semiconductor chip including contact elements on a first face and a first layer between the first face and a second face opposite the first face. Placing the semiconductor chip on a carrier with the contact elements facing the carrier and etching the semiconductor chip until the first layer is reached.

16 Claims, 4 Drawing Sheets

MANUFACTURING A SEMICONDUCTOR DEVICE VIA ETCHING A SEMICONDUCTOR CHIP TO A FIRST LAYER

BACKGROUND

Power transistors provide a high power gain and may dissipate up to 100 watts or more. Some power transistors have a vertical structure. In a vertical power metal-oxide-semiconductor field-effect-transistor (MOSFET), the voltage rating of the transistor is a function of the doping and thickness of the epitaxial layer and the current rating is a function of the channel width. This makes it possible for the transistor to sustain both high blocking voltage and high current within a compact piece of semiconductor material.

Typically, vertical power transistors have two contact elements on one face and one contact element on an opposing face. In the on state, current flows from one face to the other face. A vertical power MOSFET, usually, has source and gate contact elements on one face and a drain contact element on the other face. The vertical power MOSFET exhibits an on resistance between the drain and source terminals, where the resistance of the epitaxial layer is a primary factor in the on resistance of the transistor. Manufacturing a thin vertical power MOSFET is one way of decreasing the on resistance of the transistor.

Often, packaging semiconductor chips includes both front-end processing and back-end processing. In front-end processing, semiconductor chips can be manufactured or expanded to accommodate all of the contact elements. In back-end processing, leads can be distributed to fit a footprint on a printed circuit board.

For these and other reasons there is a need for the present invention.

SUMMARY

One embodiment described in the disclosure provides a method of manufacturing a semiconductor device. The method includes providing a semiconductor chip including contact elements on a first face and a first layer between the first face and a second face opposite the first face. Placing the semiconductor chip on a carrier with the contact elements facing the carrier and etching the semiconductor chip until the first layer is reached.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
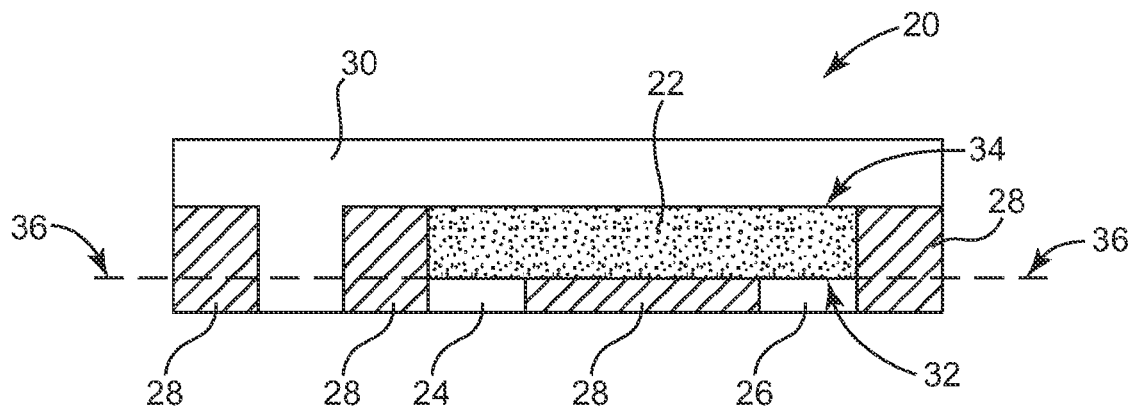
FIG. 1 is a diagram illustrating one embodiment of a semiconductor device including a selectable semiconductor device footprint.

FIG. 1 is a diagram illustrating one embodiment of a semiconductor device 20 including a selectable semiconductor device footprint. Semiconductor device 20 is an electrical circuit. In one embodiment, semiconductor device 20 is a vertical MOSFET. In one embodiment, semiconductor device 20 is a power transistor. In one embodiment, semiconductor device 20 is a vertical power transistor. In one embodiment, semiconductor device 20 is a vertical power MOSFET.

Semiconductor device 20 includes a semiconductor chip 22, a source contact 24, a gate contact 26, insulating material 28 and a drain contact 30. Semiconductor chip 22 includes a first surface 32 and a second surface 34. In one embodiment, semiconductor chip 22 includes an etch stop layer. In one embodiment, semiconductor chip 22 includes an etch stop layer substantially at second surface 34. In one embodiment, semiconductor chip 22 is a silicon chip. In one embodiment, semiconductor chip 22 is manufactured from another material, such as germanium or gallium arsenide.

Source contact 24 and gate contact 26 are situated on first surface 32 substantially in a plane at 36. The plane at 36 is substantially at first surface 32 and at source and gate contacts 24 and 26. Source contact 24 and gate contact 26 are metal contacts, such as copper or aluminum.

Insulating material 28 is situated on three sides of semiconductor chip 22, including between source contact 24 and gate contact 26. Insulating material is also on each side of drain contact 30 in the plane at 36. In one embodiment, insulating material 28 is a dielectric. In one embodiment, insulating material 28 includes an oxide. In one embodiment, insulating material 28 includes a nitride. In one embodiment, insulating material 28 is silicon dioxide.

Drain contact 30 is situated on second surface 34 and extends through insulating material 28 and the plane at 36. Drain contact 30 is a metal layer put on semiconductor chip 22 and insulating layer 28 at wafer level. If drain contact 30 is not covered by a material, such as an encapsulation material, drain contact 30 acts as a better heat sink. In one embodiment, drain contact 30 is deposited on second surface 34 at the wafer level. In one embodiment, drain contact 30 includes copper. In one embodiment, drain contact 30 includes silver.

Drain contact 30 is selectably spaced from semiconductor chip 22 and source and gate contacts 24 and 26 in the plane at 36. This spaced apart drain contact 30 and source and gate contacts 24 and 26 provide a selectable semiconductor device footprint. Also, drain contact 30 has an area that is selected to provide the selectable semiconductor device footprint. Semiconductor device 20 is attached directly to a printed circuit board (not shown) via drain contact 30 and source and gate contacts 24 and 26.

Figure 2:
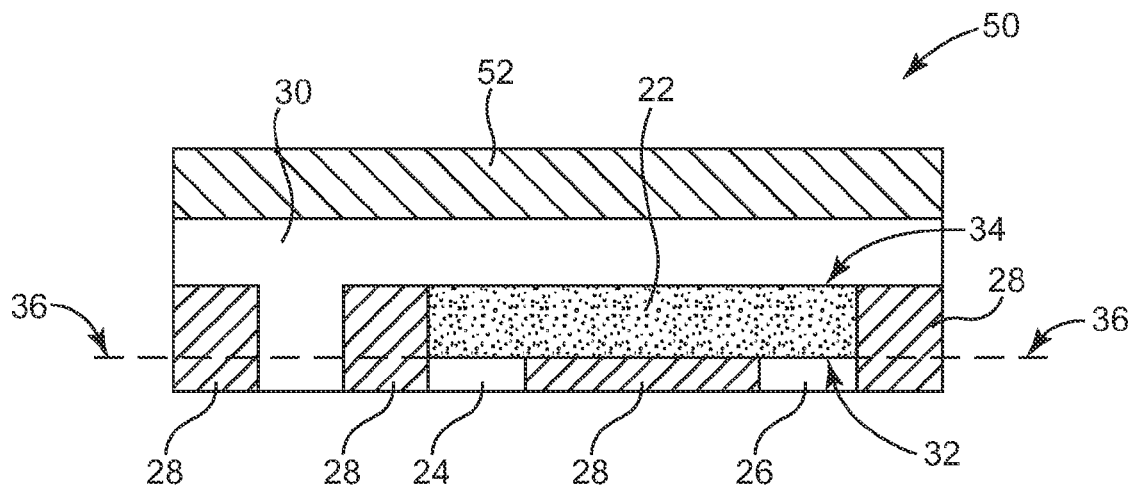
FIG. 2 is a diagram illustrating one embodiment of a semiconductor device including an encapsulation layer.

FIG. 2 is a diagram illustrating one embodiment of a semiconductor device 50 that includes an encapsulation layer 52. Semiconductor device 50 is similar to semiconductor device 20 with the exception of encapsulation layer 52. Semiconductor device 50 includes semiconductor chip 22, source contact 24, gate contact 26, insulating material 28 and drain contact 30. In addition, semiconductor device 50 includes encapsulation layer 52, which is put on semiconductor device 50 at the wafer level. In one embodiment, encapsulation layer 52 is an epoxy material. In one embodiment, encapsulation layer 52 is plastic silicon, i.e. silicone.

Semiconductor devices 20 and 50 are manufactured via a wafer-level process. Semiconductor devices 20 and 50 can be attached directly to a printed circuit board. Also, drain contact 30 and source and gate contacts 24 and 26 can be spaced apart to fit a footprint on a printed circuit board.

Figure 3:
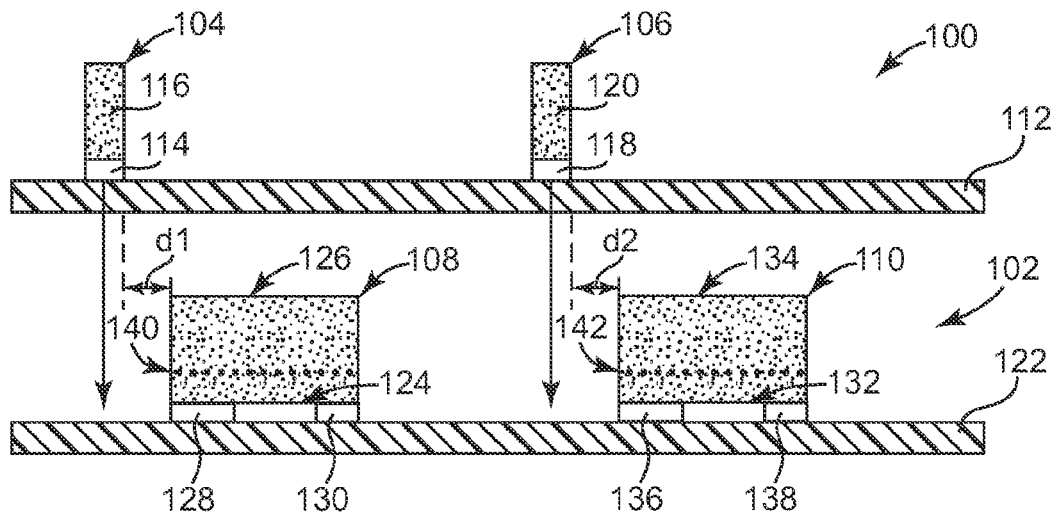
FIG. 3 is a diagram illustrating one embodiment of two wafers in a wafer-level process.

FIG. 3 is a diagram illustrating one embodiment of two wafers 100 and 102 used in a wafer-level process to manufacture semiconductor devices, such as semiconductor devices 20 and 50. One of the wafers is a sacrificial wafer or inactive wafer 100 that includes inactive semiconductor elements 104 and 106. The other wafer, active wafer 102 includes active semiconductor chips 108 and 110.

Inactive wafer 100 includes inactive semiconductor elements 104 and 106 on a first carrier or sawing foil 112. First semiconductor element 104 includes a first metallization contact 114 and semiconductor material 116 and second semiconductor element 106 includes a second metallization contact 118 and semiconductor material 120. Each of the semiconductor elements 104 and 106 are situated on first foil 112 with metallization contacts 114 and 118 facing first foil 112.

Active wafer 102 includes semiconductor chips 108 and 110 on a second carrier or sawing foil 122. First semiconductor chip 108 includes a contact face 124 and an opposing face 126. A first source contact 128 and a first gate contact 130 are situated on contact face 124. Second semiconductor chip 106 includes a contact face 132 and an opposing face 134. A second source contact 136 and a second gate contact 138 are situated on contact face 132. Each of the semiconductor chips 108 and 110 are situated on second foil 122 with source contacts 128 and 136 and gate contacts 130 and 138 facing second foil 122.

Each of the semiconductor chips 108 and 110 includes an etch stop layer, indicated via the dotted line. First semiconductor chip 108 includes first etch stop layer 140 and second semiconductor chip 110 includes second etch stop layer 142. In one embodiment, charged particles were implanted into each of the semiconductor chips 108 and 110 to provide etch stop layers 140 and 142. In one embodiment, charged particles were implanted through contact faces 124 and 132 to provide etch stop layers 140 and 142.

Inactive wafer 100 is diced via sawing wafer 100 and inactive semiconductor elements 104 and 106 are bonded onto second foil 122 next to semiconductor chips 108 and 110. Inactive semiconductor element 104 is placed a spaced apart distance d1 from semiconductor chip 108 and inactive semiconductor element 106 is placed a spaced apart distance d2 from semiconductor chip 110. The distances d1 and d2 are selected to provide the selectable footprint of semiconductor devices 20 and 50. Inactive semiconductor elements 104 and 106 are used to provide drain contacts for semiconductor chips 108 and 110, respectively.

Figure 4:
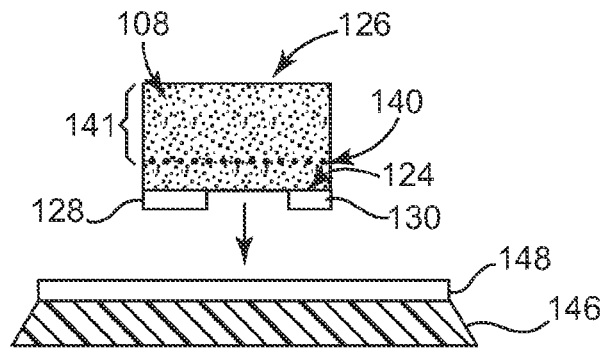
FIG. 4 is a diagram illustrating one embodiment of a semiconductor chip being placed on a wafer carrier.

FIG. 4 is a diagram illustrating one embodiment of semiconductor chip 108 placed on wafer carrier 146. Semiconductor chip 108 includes contact face 124 and opposing face 126. First source contact 128 and first gate contact 130 are situated on contact face 124 and etch stop layer 140 is situated between contact face 124 and opposing face 126.

Semiconductor chip 108 is placed on carrier 146 with first source contact 128 and first gate contact 130 facing carrier 146. Semiconductor chip 108 is attached to wafer carrier 146 via adhesive layer 148 with source contact 128 and gate contact 130 facing adhesive layer 148 and wafer carrier 146.

To produce a thin semiconductor device, semiconductor chip 108 is etched from opposing face 126 down to etch stop layer 140, removing top portion 141.

Figure 5:
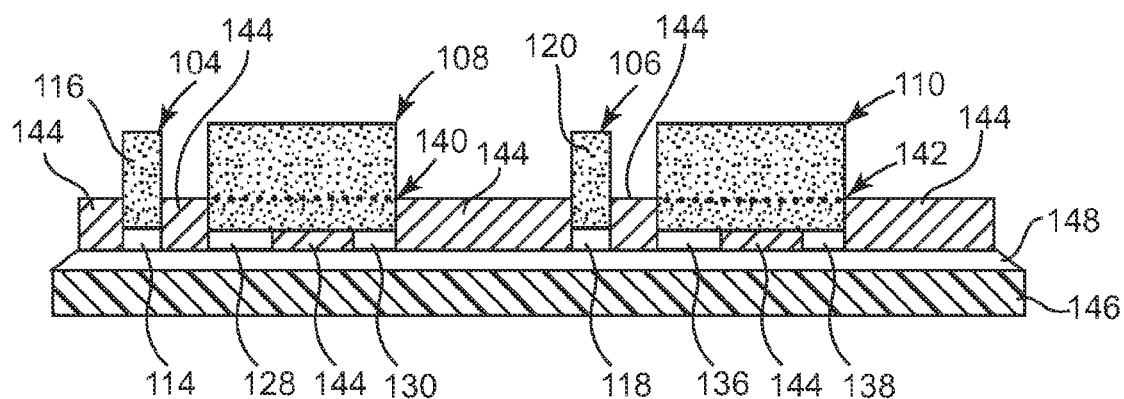
FIG. 5 is a diagram illustrating one embodiment of semiconductor elements, semiconductor chips and an insulating layer on a wafer carrier.

FIG. 5 is a diagram illustrating one embodiment of semiconductor elements 104 and 106 and semiconductor chips 108 and 110 and an insulating layer 144 on a wafer carrier 146. Insulating material 144 is put down between inactive semiconductor elements 104 and 106 and semiconductor chips 108 and 110 and under semiconductor chips 108 and 110, between source contact 128 and gate contact 130 and between source contact 136 and gate contact 138.

Each of the semiconductor elements 104 and 106 and each of the semiconductor chips 108 and 110 are attached to wafer carrier 146 via adhesive layer 148. Semiconductor element 104 is situated on adhesive layer 148 with metallization contact 114 facing adhesive layer 148 and wafer carrier 146. Semiconductor element 106 is situated on adhesive layer 148 with metallization contact 118 facing adhesive layer 148 and wafer carrier 146. Semiconductor chip 108 is situated on adhesive layer 148 with source contact 128 and gate contact 130 facing adhesive layer 148 and wafer carrier 146. Semiconductor chip 110 is situated on adhesive layer 148 with source contact 136 and gate contact 138 facing adhesive layer 148 and wafer carrier 146.

In one embodiment, insulating material 144 is applied with inactive semiconductor elements 104 and 106 and semiconductor chips 108 and 110 on second foil 122, where semiconductor elements 104 and 106 and semiconductor chips 108 and 110 with insulating material 144 are moved from second foil 122 to wafer carrier 146. In one embodiment, insulating material 144 is spin coated on. In one embodiment, insulating material 144 is put down to provide an insulating material thickness of 10-20 micrometers. In one embodiment, insulating material 144 is put down to provide an insulating material thickness that extends substantially from second foil 122 (or adhesive layer 148) to etch stop layers 140 and 142. In one embodiment, insulating material 144 includes polyimide. In one embodiment, insulating material 144 includes plastic silicon, i.e. silicone.

Figure 6:
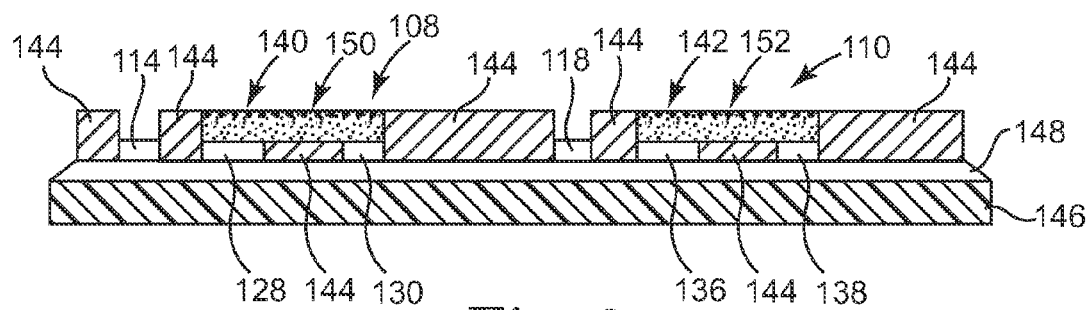
FIG. 6 is a diagram illustrating one embodiment of metallization contacts, etched semiconductor chips and an insulating layer on a wafer carrier.

FIG. 6 is a diagram illustrating one embodiment of metallization contacts 114 and 118, etched semiconductor chips 108 and 110 and insulating layer 144 on adhesive layer 148 and wafer carrier 146. As previously described, semiconductor chip 108 is situated on adhesive layer 148 with source contact 128 and gate contact 130 facing adhesive layer 148 and wafer carrier 146, and semiconductor chip 110 is situated on adhesive layer 148 with source contact 136 and gate contact 138 facing adhesive layer 148 and wafer carrier 146. In one embodiment, each of the source contacts 128 and 136 is less than 20 micrometers thick. In one embodiment, each of the gate contacts 130 and 138 is less than 20 micrometers thick.

Semiconductor material at 116 and 120 (shown in FIGS. 3 and 5) is etched away to provide bare metallization contacts 114 and 118 on adhesive layer 148. The spaces above metallization contacts 114 and 118 are used to provide connections through insulating material 144 for the drain contacts of semiconductor chips 108 and 110. The footprint area of semiconductor elements 104 and 106 is selected to provide metallization contacts 114 and 118 having footprint areas that match the selected semiconductor device footprint. In one embodiment, each of the bare metallization contacts 114 and 118 is less than 20 micrometers thick.

Semiconductor chips 108 and 110 are etched down to etch stop layers 140 and 142 to provide thinner epitaxial layers. Semiconductor chip 108 is etched to etch stop layer 140 at surface 150 and semiconductor chip 110 is etched to etch stop layer 142 at surface 152. In one embodiment, semiconductor chips 108 and 110 are etched to have a thickness of less than 100 micrometers. In one embodiment, semiconductor material 116 and 120 and semiconductor chips 108 and 110 are etched in the same etching process. In one embodiment, semiconductor material 116 and 120 and semiconductor chips 108 and 110 are etched in a chemical etch.

Figure 7:
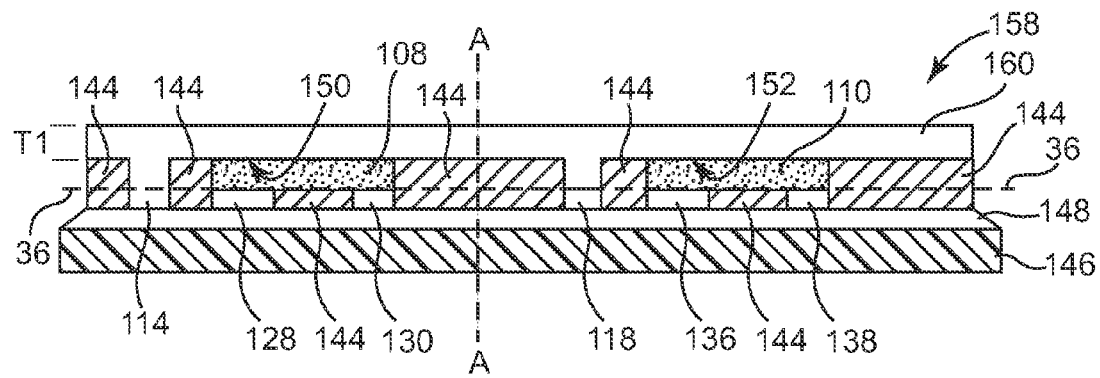
FIG. 7 is a diagram illustrating one embodiment of a wafer including a drain contact metallization layer.

FIG. 7 is a diagram illustrating one embodiment of a wafer 158 including drain contact metallization layer 160 on metallization contacts 114 and 118, etched semiconductor chips 108 and 110 and insulating layer 144. As previously described, semiconductor chip 108 is situated on adhesive layer 148 with source contact 128 and gate contact 130 facing adhesive layer 148 and wafer carrier 146, and semiconductor chip 110 is situated on adhesive layer 148 with source contact 136 and gate contact 138 facing adhesive layer 148 and wafer carrier 146.

Drain contact metallization layer 160 is put on metallization contacts 114 and 118, etched semiconductor chips 108 and 110 and insulating layer 144. The drains of semiconductor chips 108 and 110 are at surfaces 150 and 152, respectively. Drain contact metallization layer 160 contacts the drains of semiconductor chips 108 and 110 at surfaces 150 and 152 and the metallization contacts 114 and 118 to provide connections through insulating material 144 for the drain contacts of semiconductor chips 108 and 110. The spacing between metallization contacts 114 and 118 and semiconductor chips 108 and 110, respectively, in the plane at 36 and the footprint area of metallization contacts 114 and 118 are selected to match the selected semiconductor device footprint. In one embodiment, drain contact metallization layer 160 includes copper. In one embodiment, drain contact metallization layer 160 includes silver. In one embodiment, drain contact metallization layer 160 is put on in an electrochemical galvanic deposition.

Higher power transistors have thicker metallization. In one embodiment, drain contact metallization layer 160 is 20-500 micrometers thick T1. In one embodiment, drain contact metallization layer 160 is 50-250 micrometers thick T1.

Figure 8:
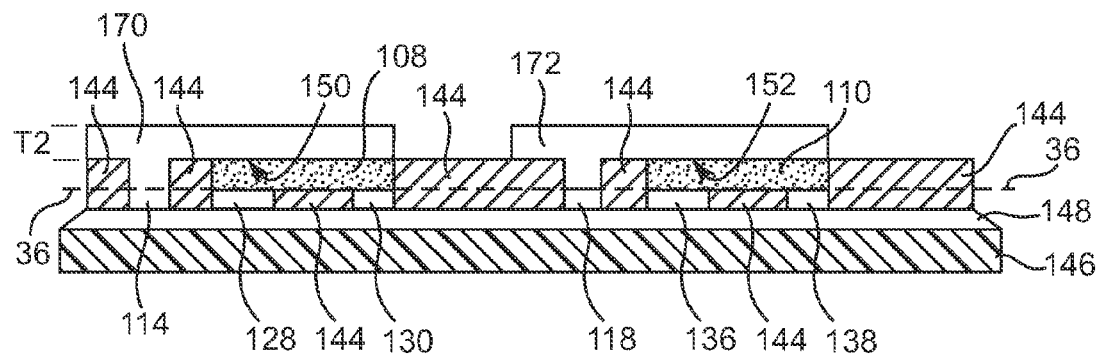
FIG. 8 is a diagram illustrating one embodiment of structured drain contact metallization layers on metallization contacts, etched semiconductor chips and an insulating layer.

FIG. 8 is a diagram illustrating one embodiment of structured drain contact metallization layers 170 and 172 on metallization contacts 114 and 118, etched semiconductor chips 108 and 110 and insulating layer 144. Structured drain contact metallization layer 170 is on metallization contact 114, etched semiconductor chip 108 and portions of insulating layer 144. Structured drain contact metallization layer 172 is on metallization contact 118, etched semiconductor chip 110 and other portions of insulating layer 144.

As previously described, semiconductor chip 108 is situated on adhesive layer 148 with source contact 128 and gate contact 130 facing adhesive layer 148 and wafer carrier 146, and semiconductor chip 110 is situated on adhesive layer 148 with source contact 136 and gate contact 138 facing adhesive layer 148 and wafer carrier 146. The drains of semiconductor chips 108 and 110 are at surfaces 150 and 152, respectively.

Structured drain contact metallization layer 170 contacts the drain of semiconductor chip 108 at surface 150 and it contacts metallization contact 114 to provide an electrical connection through insulating material 144 for the drain contact of semiconductor chip 108. The spacing between metallization contact 114 and semiconductor chip 108 in the plane at 36 and the footprint area of metallization contact 114 are selected to match the selected semiconductor device footprint.

Structured drain contact metallization layer 172 contacts the drain of semiconductor chip 110 at surface 152 and it contacts metallization contact 118 to provide an electrical connection through insulating material 144 for the drain contact of semiconductor chip 110. The spacing between metallization contact 118 and semiconductor chip 110 in the plane at 36 and the footprint area of metallization contact 118 are selected to match the selected semiconductor device footprint.

In one embodiment, wafer 158 of FIG. 7 is etched to provide structured drain contact metallization layers 170 and 172. In one embodiment, a metallization layer is put over metallization contacts 114 and 118, etched semiconductor chips 108 and 110 and insulating layer 144 and etched to provide structured drain contact metallization layers 170 and 172. In one embodiment, a metallization layer is put on in an electrochemical galvanic deposition and etched to provide the structured drain contact metallization layers 170 and 172. In one embodiment, structured drain contact metallization layers 170 and 172 include copper. In one embodiment, structured drain contact metallization layers 170 and 172 include silver.

Higher power transistors have thicker metallization. In one embodiment, structured drain contact metallization layers 170 and 172 are 20-500 micrometers thick T2. In one embodiment, structured drain contact metallization layers 170 and 172 are 50-250 micrometers thick T2.

Figure 9A:
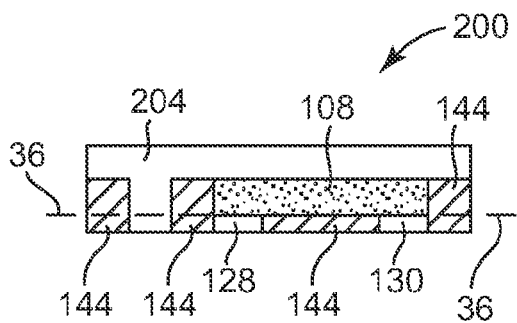
FIGS. 9A and 9B are diagrams illustrating embodiments of semiconductor devices similar to the semiconductor device of FIG. 1.
Figure 9B:
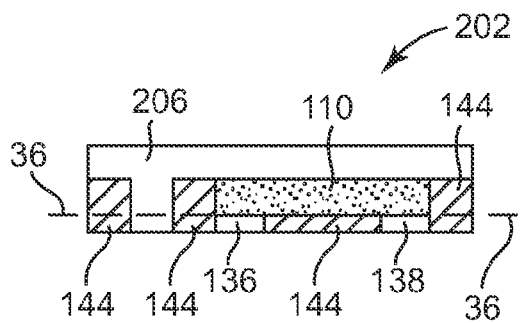

FIGS. 9A and 9B are diagrams illustrating embodiments of semiconductor devices 200 and 202. Each of the semiconductor devices 200 and 202 includes a selectable semiconductor device footprint. Also, each of the semiconductor devices 200 and 202 is similar to semiconductor device 20 of FIG. 1.

Wafer 158 of FIG. 7 is diced, such as along line A (shown in FIG. 7), and wafer carrier 146 and adhesive layer 148 are removed to provide semiconductor devices 200 and 202. In one embodiment, wafer 158 is mechanically sawed to provide semiconductor devices 200 and 202. In one embodiment, wafer 158 is cut via laser cutting to provide semiconductor devices 200 and 202.

Semiconductor device 200 of FIG. 9A includes semiconductor chip 108, source contact 128, gate contact 130, insulating material 144 and drain contact 204, where drain contact 204 includes metallization contact 114 and part of metallization layer 160. Drain contact 204 is selectably spaced from semiconductor chip 108 and source and gate contacts 128 and 130 in the plane at 36. The spaced apart drain contact 204 and source and gate contacts 128 and 130 provide a selectable semiconductor device footprint. Also, drain contact 204 has a footprint area that is selected to provide the selectable semiconductor device footprint. Semiconductor device 200 is attached directly to a printed circuit board (not shown) via drain contact 204 and source and gate contacts 128 and 130.

Semiconductor device 202 of FIG. 9B includes semiconductor chip 110, source contact 136, gate contact 138, insulating material 144 and drain contact 206, where drain contact 206 includes metallization contact 118 and part of metallization layer 160. Drain contact 206 is selectably spaced from semiconductor chip 110 and source and gate contacts 136 and 138 in the plane at 36. The spaced apart drain contact 206 and source and gate contacts 136 and 138 provide a selectable semiconductor device footprint. Also, drain contact 206 has a footprint area that is selected to provide the selectable semiconductor device footprint. Semiconductor device 202 is attached directly to a printed circuit board (not shown) via drain contact 206 and source and gate contacts 136 and 138.

Figure 10:
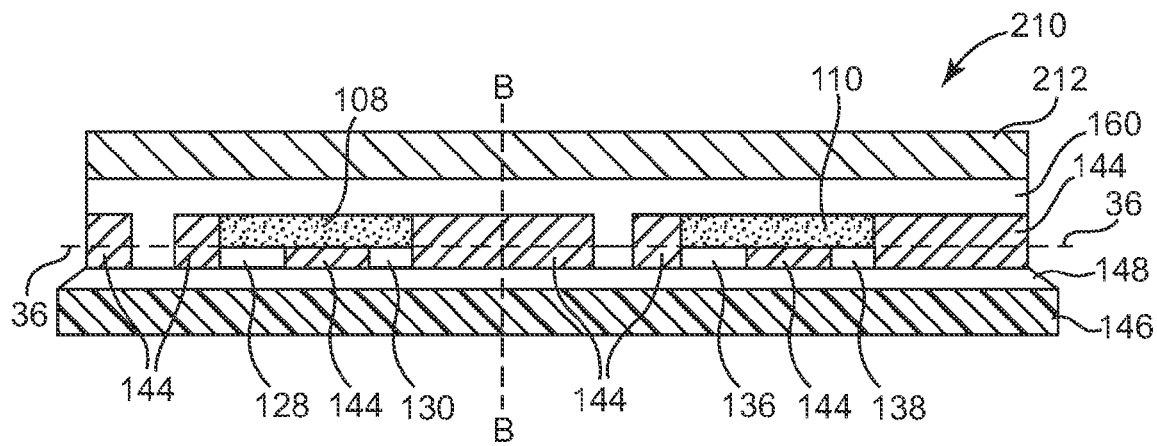
FIG. 10 is a diagram illustrating one embodiment of a wafer including an encapsulation layer.

FIG. 10 is a diagram illustrating one embodiment of a wafer 210 including an encapsulation layer 212 on metallization layer 160 (shown in FIG. 7). Wafer 210 is similar to wafer 158 of FIG. 7, with the exception of encapsulation layer 212.

Wafer 210 includes semiconductor chip 108 situated on adhesive layer 148 with source contact 128 and gate contact 130 facing adhesive layer 148 and wafer carrier 146, and semiconductor chip 110 situated on adhesive layer 148 with source contact 136 and gate contact 138 facing adhesive layer 148 and wafer carrier 146. Drain contact metallization layer 160 is on metallization contacts 114 and 118, etched semiconductor chips 108 and 110 and insulating layer 144.

Encapsulation layer 212 is put on drain contact metallization layer 160 at the wafer level. In one embodiment, encapsulation layer 212 is an epoxy material. In one embodiment, encapsulation layer 212 is plastic silicon, i.e. silicone.

Figure 11A:
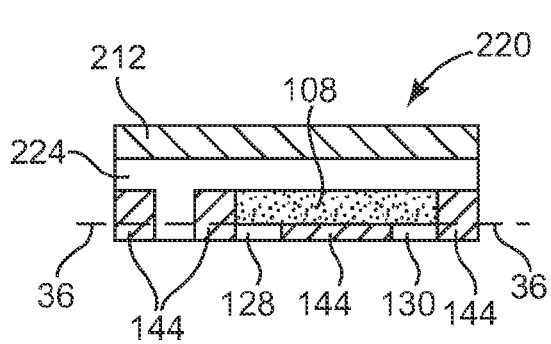
FIGS. 11A and 11B are diagrams illustrating embodiments of semiconductor devices similar to the semiconductor device of FIG. 2.
Figure 11B:
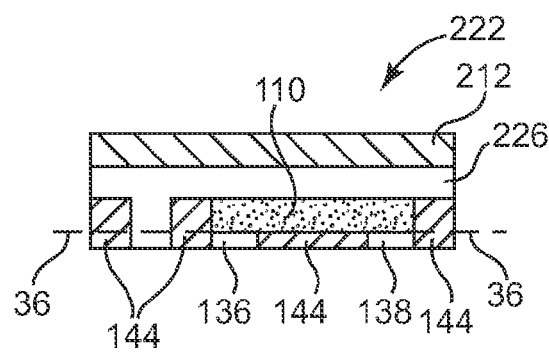

FIGS. 11A and 11B are diagrams illustrating embodiments of semiconductor devices 220 and 222. Each of the semiconductor devices 220 and 222 includes a selectable semiconductor device footprint. Also, each of the semiconductor devices 220 and 222 is similar to semiconductor device 50 of FIG. 2.

Wafer 210 of FIG. 10 is diced, such as along line B (shown in FIG. 10), and wafer carrier 146 and adhesive layer 148 are removed to provide semiconductor devices 220 and 222. In one embodiment, wafer 210 is mechanically sawed to provide semiconductor devices 220 and 222. In one embodiment, wafer 210 is cut via laser cutting to provide semiconductor devices 220 and 222.

Semiconductor device 220 of FIG. 11A includes semiconductor chip 108, source contact 128, gate contact 130, insulating material 144, drain contact 224 that includes metallization contact 114 and part of metallization layer 160, and encapsulation layer 212. Drain contact 224 is selectably spaced from semiconductor chip 108 and source and gate contacts 128 and 130 in the plane at 36. The spaced apart drain contact 224 and source and gate contacts 128 and 130 provide a selectable semiconductor device footprint. Also, drain contact 224 has a footprint area that is selected to provide the selectable semiconductor device footprint. Semiconductor device 220 is attached directly to a printed circuit board (not shown) via drain contact 224 and source and gate contacts 128 and 130.

Semiconductor device 222 of FIG. 11B includes semiconductor chip 110, source contact 136, gate contact 138, insulating material 144, drain contact 226 that includes metallization contact 118 and part of metallization layer 160, and encapsulation layer 212. Drain contact 226 is selectably spaced from semiconductor chip 110 and source and gate contacts 136 and 138 in the plane at 36. The spaced apart drain contact 226 and source and gate contacts 136 and 138 provide a selectable semiconductor device footprint. Also, drain contact 226 has a footprint area that is selected to provide the selectable semiconductor device footprint. Semiconductor device 222 is attached directly to a printed circuit board (not shown) via drain contact 226 and source and gate contacts 136 and 138.

Semiconductor devices 200 and 202 and semiconductor devices 220 and 222 are manufactured via wafer-level processes. Each of the semiconductor devices 200, 202, 220 and 222 can be attached directly to a printed circuit board. Also, drain contacts and source and gate contacts can be spaced apart to fit a footprint on a printed circuit board.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device comprising:
   providing a semiconductor chip including contact elements;
   placing the semiconductor chip on a carrier with the contact elements facing the carrier;
   providing a semiconductor element including a metallization contact and semiconductor material on the metallization contact;
   placing the semiconductor element on the carrier with the metallization contact facing the carrier;
   applying an insulating material over the carrier; and
   etching the semiconductor material to expose the metallization contact and form a through-connection in the insulating material to the metallization contact.

2. The method of claim 1, comprising:
   etching the semiconductor chip; and
   applying a metal layer over the etched semiconductor chip.

3. The method of claim 1, comprising:
   applying a metal layer over the semiconductor chip and the insulating material and the metallization contact.

4. The method of claim 1, comprising:
   implanting charged particles into the semiconductor chip.

5. The method of claim 4, wherein implanting charged particles comprises:
   implanting charged particles through the first face of the semiconductor chip.

6. The method of claim 1, wherein etching the semiconductor chip comprises:
etching the semiconductor chip until the semiconductor chip has a thickness of less than 100 micrometers.

7. The method of claim 1, comprising:
removing the carrier from the semiconductor chip.

8. A method of manufacturing a semiconductor device comprising:
providing a semiconductor chip including a contact element on a first face and an etch stop layer between the first face and a second face opposite the first face;
placing the semiconductor chip on a carrier with the contact element facing the carrier;
placing a semiconductor element on the carrier and spaced apart from the semiconductor chip, wherein the semiconductor element includes a metallization contact facing the carrier and semiconductor material on the metallization contact;
applying an insulating material over the carrier to form an insulating layer between the semiconductor chip and the semiconductor element;
etching away the semiconductor material to expose the metallization contact and form a through-connection in the insulating layer to the metallization contact; and
etching the semiconductor chip until the etch stop layer is reached.

9. The method of claim 8, comprising:
applying a metal layer over the etched semiconductor chip and the insulating layer and through the through-connection in the insulating layer to the metallization contact.

10. A method of manufacturing a semiconductor device comprising:
providing a semiconductor chip from an active wafer, wherein the semiconductor chip includes a contact element on a first face and a second face opposite the first face;
placing the semiconductor chip on a carrier with the contact element facing the carrier;
providing a semiconductor element from a sacrificial wafer, wherein the semiconductor element includes a metallization contact and semiconductor material; and
placing the semiconductor element on the carrier a selected distance from the semiconductor chip and with the metallization contact facing the carrier.

11. The method of claim 10, comprising:
applying an insulating material over the carrier to form an insulating layer between the semiconductor chip and the semiconductor element.

12. The method of claim 11, comprising:
etching the semiconductor chip down to an etch stop layer; and
etching the semiconductor element down to the metallization contact to form a through-connection in the insulating material.

13. The method of claim 12, comprising:
applying a metal layer over the etched semiconductor chip and the insulating layer and through the through-connection in the insulating material to contact the metallization contact.

14. A method of manufacturing a power transistor comprising:
providing a vertical MOSFET chip including source and gate contacts on a first face and an etch stop layer between the first face and a second face opposite the first face;
placing the vertical MOSFET chip on a carrier with the source and gate contacts facing the carrier;
providing an inactive element that includes a metallization contact and semiconductor material;
placing the inactive element on the carrier at a selected distance from the vertical MOSFET chip and with the metallization contact facing the carrier; and
etching the vertical MOSFET chip on the second face down to the first layer to provide a drain contact for the power transistor.

15. The method of claim 14, comprising:
applying an insulating material over the carrier to form an insulating layer between the vertical MOSFET chip and the inactive element; and
etching the inactive element down to the metallization contact to form a through-connection in the insulating material.

16. The method of claim 15, comprising:
applying a metal layer on the etched vertical MOSFET chip and the insulating layer and through the through-connection in the insulating material to contact the metallization contact and form the drain contact of the power transistor.

* * * * *